United States Patent [19]

Zabel et al.

[11] Patent Number: 4,835,472

[45] Date of Patent: May 30, 1989

[54] LOCAL COIL FOR DETECTING NUCLEAR MAGNETIC RESONANCE SIGNALS FROM AN EXAMINATION SUBJECT

[75] Inventors: Hans-Joachim Zabel; Walter Lorenz, both of Heidelberg, Fed. Rep. of Germany

[73] Assignee: Siemens Aktiengesellschaft, Berlin and Munich, Fed. Rep. of Germany

[21] Appl. No.: 226,890

[22] Filed: Aug. 1, 1988

[30] Foreign Application Priority Data

Aug. 13, 1987 [DE] Fed. Rep. of Germany ....... 3727056

[51] Int. Cl.$^4$ ............................................ G01R 33/20
[52] U.S. Cl. ................................................... 324/318
[58] Field of Search ............... 324/300, 307, 309, 318, 324/313, 314, 319, 322; 333/17 M, 205, 219, 235; 334/41, 45, 55

[56] References Cited

U.S. PATENT DOCUMENTS

| 4,620,155 | 10/1986 | Edelstein | 324/318 |
|---|---|---|---|
| 4,621,237 | 11/1986 | Timms | 324/322 |
| 4,707,662 | 11/1987 | Kemner et al. | 324/318 |
| 4,714,887 | 12/1987 | Meissner | 324/322 |
| 4,739,269 | 4/1988 | Kopp | 324/322 |
| 4,775,837 | 10/1988 | Roschmann | 324/322 |

FOREIGN PATENT DOCUMENTS

| 0222982 | 8/1986 | European Pat. Off. |
| WO82/00378 | 2/1982 | PCT Int'l Appl. |
| WO84/00214 | 1/1984 | PCT Int'l Appl. |
| 2159958 | 12/1985 | United Kingdom |

*Primary Examiner*—Michael J. Tokar
*Attorney, Agent, or Firm*—Hill, Van Santen, Steadman & Simpson

[57] ABSTRACT

A local coil for detecting nuclear magnetic resonance signals from an examination subject, for spectroscopic analysis or image construction, has a coaxial conductor member shaped to form a first turn of the coil, with the inner conductor of the coaxial member exiting the jacket upon the completion of the first turn, and the unshielded inner conductor forming a second turn of the coil in the same winding direction as the first turn, and being connected to the jacket upon completion of the second turn. The coil is thus symmetrical with respect to ground, independent of frequency, and is balanced so that it can be directly connected to an asymmetrical coaxial cable.

10 Claims, 2 Drawing Sheets

LOCAL COIL FOR DETECTING NUCLEAR MAGNETIC RESONANCE SIGNALS FROM AN EXAMINATION SUBJECT

BACKGROUND OF THE INVENTION

1. Field of the Invention

The present invention is directed to a local coil for acquiring nuclear magnetic resonance signals from an examination subject, for use in the spectroscopic analysis or the construction of an image of the subject.

2. Description of the Prior Art

A local coil for use in acquiring nuclear magnetic resonance signals from an examination subject is known from Published European application No. 0 222 982, corresponding to co-pending U.S. application Ser. No. 921,779, filed Oct. 22, 1986 (Zabel, Bader and Lorenz). This coil has a coaxial conductor member forming a first turn or winding of the coil, with the inner conductor exiting from the jacket shielding at the end of the coaxial conductor member, and being electrically connected to the jacket at the starting point of the first turn.

Local coils of this type are used in nuclear magnetic resonance tomography and nuclear magnetic resonance spectroscopy when specific portions of an examination subject are to be analyzed or imaged with an improved signal-to-noise ratio. As is known, the examination subject is disposed in a uniform fundamental field of a magnetic resonance installation. The local coil is positioned in the proximity of the region to be examined. Nuclear spins in the examination subject are excited by radio-frequency pulses in the region to be examined. This excitation can ensue either using the local coil, or using an antenna covering the entire examination region. Subsequently, the nuclear magnetic resonance signal emitted by the excited spinning nuclei is detected by the local coil, and stored in the installation. Gradient magnetic fields may be additionally superimposed on the uniform fundamental magnetic field for topically resolved spectroscopy and for imaging.

A conventional local coil of this type for explaining the problems in this technology is shown in FIG. 1. This local coil consists of two coaxial windings or turns 1 and 2. An increase in the total inductivity of the local coil, and thus as enhancement of the signal-to-noise ratio, are achieved by the presence of the second winding, in comparison to a coil having a single winding. The local coil is connected via a coaxial line 4 to a receiver or to a combined transmission/reception stage 5. The coaxial line 4 is asymmetrical relation to ground. In order to have a connection of the local coil which is symmetrical relative to ground, a balancing circuit must be provided within a matching unit 3. The balancing circuit consists of a differential variable capacitance, consisting of two capacitors 3a and 3b connected in series. The differential variable capacitance is connected to the two terminals of the windings 1 and 2. The inner conductor of the coaxial line 4 is connected to a terminal of the local coil via a variable matching capacitor 3c, and the jacket shielding of the coaxial line is connected to the junction of the two capacitors 3a and 3b.

With this arrangement, a differential variable capacitance, i.e., two capacitors having a shared matching capability, is required. Moreover, the balancing circuit is not independent of frequency. The matching stage 3 must be disposed in the immediate proximity of the local coil, which is a practical disadvantage in positioning the local coil on the examination subject.

The aforementioned European application No. 0 222 982 discloses a local coil which can be connected to a coaxial line without the need for a balancing circuit. The local coil is formed by a loop of a coaxial conductor. To increase the total inductivity, the coaxial conductor can have a plurality of turns or windings. In this case, however, the local coil becomes unwieldy due to the relatively large diameter of the coaxial line, and capacitive detuning by the examination subject also increases due to the large conductor surface. Moreover, if the turns or windings are to be respectively disposed in individual planes, which are parallel to each other, the transition between the turns, i.e., between the planes, becomes difficult to manufacture due to the large diameter of the jacket shielding.

SUMMARY OF THE INVENTION

It is an object of the present invention to provide a local coil formed from coaxial cable for detecting nuclear magnetic resonance signals from an examination subject which has a simple, compact structure, and wherein capacitive detuning by the examination subject is slight.

The above object is achieved in accordance with the principles of the present invention by forming the coil from one turn of jacketed coaxial cable and at least one second turn formed by the unshielded inner conductor of the cable, the further turns of the unshielded inner conductor being wound in the same direction as the winding direction of the first turn, and the end of the unshielded conductor, upon completion of the further turns, being electrically connected to the coaxial conductor jacket at the starting point of the first turn.

The inner conductor, without the jacket shielding, has a significantly smaller diameter than the complete coaxial cable. As a result, the structural volume of the coil is reduced, and capacitive coupling with the examination subject, which is dependent on the surface area of the conductor, is also reduced.

The local coil can be connected to a matching circuit via a coaxial line, and the matching circuit can be disposed outside of the examination region, thereby facilitating placement and manipulation of the local coil.

The first turn and the further turns of the local coil may have different diameters, so that the further turns can be disposed in the same plane as the first turn, so that the total height of the local coil is reduced.

DESCRIPTION OF THE PREFERRED EMBODIMENTS

Figure 1:
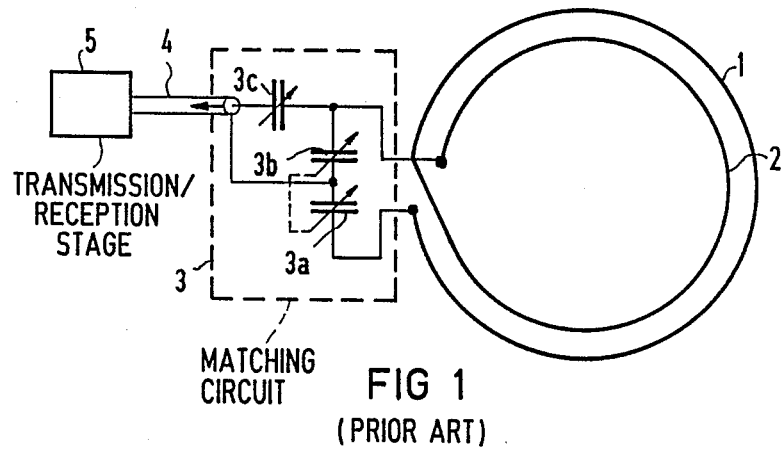
FIG. 1 is a schematic diagram of a conventional local coil for detecting nuclear magnetic resonance signals.
Figure 2:
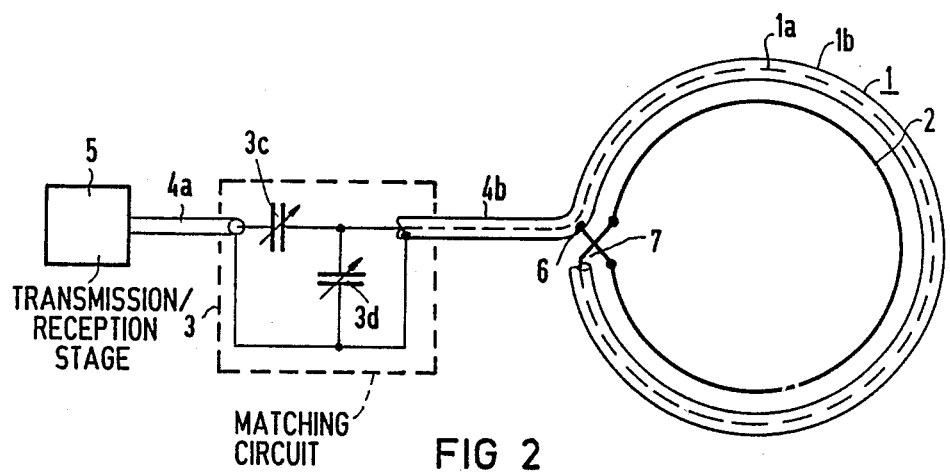
FIG. 2 is a schematic diagram of a local coil in a first embodiment for detecting nuclear magnetic resonance signals constructed in accordance with the principles of the present invention.

As shown in FIG. 2, a local coil constructed in accordance with the principles of the present invention for detecting nuclear magnetic resonance signals in an examination subject is connected to a transmission/reception stage 5 via a coaxial line 4 and a matching circuit 3. The matching circuit 3 includes a matching capacitor 3c connected in series with the inner conductor of the coaxial line 4, and a tuning capacitor 3d connected between the inner conductor and the jacket shielding of the coaxial line 4. The tuning capacitor 3d is provided for matching the local coil to the operating frequency. The conductor section 4b of the coaxial between the matching circuit 3 and the local coil is preferably selected of a length such that the matching circuit 3 can be disposed outside of the examination region. It is also possible, however, to directly connect the local coil 1 to the matching circuit 3, i.e., without the interposition of the conductor section 4b.

In the embodiment of FIG. 2, the local coil has a first winding 1 which is a continuation of the coaxial line 4. The inner conductor 1a of the coaxial line 4 exits the jacket shielding 1b at an end 7 of the first turn, and the unshielded inner conductor is shaped into a further turn 2 without jacket shielding, the further turn 2 being concentric with the first turn 1. The free end of the inner conductor 1a is connected to the jacket shielding 1b at a starting point 6 of the first turn 1. Both turns 1 and 2 have the same winding direction.

In the embodiment of FIG. 2, the jacket shielding 1b of the first turn 1 acts as a balancing element for the inner conductor 1a in that turn. As a consequence of the capacitive shunt between the inner conductor 1a and the jacket shielding 1b, the point 7 at which the inner conductor 1a exits the jacket shielding 1b has, as seen from the connection point 6, a medium potential which is symmetrical relative to ground. The connection point 6 therefore is at ground potential without being directly grounded.

The asymmetrical coaxial line 4 functioning as a connection line to the transmission/reception stage 5, does not disturb the current distribution in the local coil, nor does it disturb the symmetry of the arrangement, since the outer conductor 1b has no voltage relative to ground. As a result, there are no jacket currents in the jacket shielding 1b which could be coupled into the local coil via the examination subject caused by stray fields. Such stray currents would lead to a frequency detuning of the local coil thereby degrading the system quality and thus deteriorating the sensitivity of the system.

The conductor surface of the second turn 2 is, moreover, reduced with respect to the conductor surface of the first turn 1, which is the outer diameter of the jacket 1b. Typically, the unshielded conductor forming the second turn 2, if not a continuation of the conductor 1a, will have a diameter which is twice the diameter of the inner conductor 1a. This keeps losses low and also keeps the capacitance of the winding 2 from becoming excessively high. Since the jacket shielding 1b usually has four times the diameter of the inner conductor 1a, the unshielded conductor forming the winding 2 will have half of the diameter of the jacket shielding 1b. The second turn 2 will thus be subject to capacitive detuning by the examination subject which is lower by a factor of 2 than the capacitive detuning to which the jacket shielding 1b, and thus the first turn 1, are subject. Therefore, in the embodiment of FIG. 2 wherein only a single additional turn is provided, the second turn 2 will be turned toward the examination subject.

Balancing to the resonant frequency is achieved by the capacitor 3d in the matching circuit 3, and matching to the line impedance is achieved by the capacitor 3c.

The diameters of the turns 1 and 2 can be different, which permits the second turn 2 to be placed in the same plane as the first turn 1. Moreover, the distance between the turns can be varied.

For better adaptation to an examination subject, the local coil can be shaped rectangularly, quadratically, or elliptically, as alternatives to the circular shape shown in the drawings. Moreover, the respective turns need not all have the same geometrical shape, with combinations of shapes being possible.

As noted above, placement of all of the turns of the coil in the same plane can be easily achieved, however, placement of the respective turns in different parallel planes can also be easily achieved, because the transition between the various planes does not present manufacturing difficulties due to the relatively small diameter of the unshielded conductor forming the remaining turns after the first turn.

Figure 3:
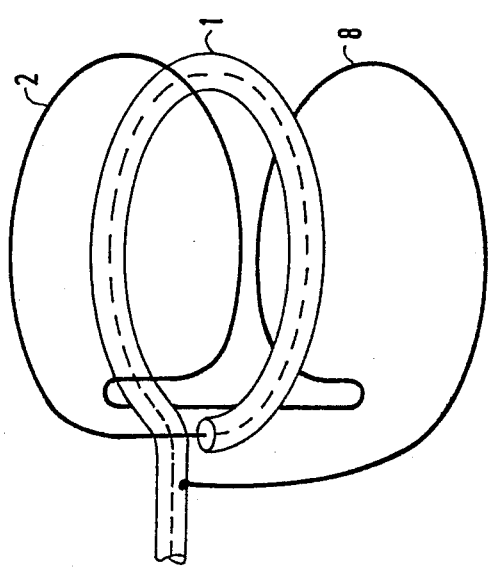
FIG. 3 is a perspective view of a second embodiment of a local coil for detecting nuclear magnetic resonance signals constructed in accordance with the principles of the present invention.

A further embodiment of the invention is shown in FIG. 3. In this embodiment, two further turns 2 and 8 comprised of unshielded conductor are shown. The further turns 2 and 8 are arranged concentrically in parallel planes relative to the first turn 1, with the first turn 1 being disposed between the two further turns 2 and 8.

More than two additional turns can be provided, so that the inductivity of the local coil can be further increased. The practical limit to the number of turns is only that the balancing effect of the turn 1, which is the only turn executed as a coaxial line, diminishes with an increasing number of additional turns of unshielded conductor. If, for example, one of the turns 2 or 8 were omitted in the embodiment of FIG. 3, a Helmholtz arrangement is obtained.

Given the use of a coaxial line connecting the local coil 1 and the matching circuit 3, the losses of the coaxial line are transformed into the resonant circuit of the local coil. This leads to a reduction of the circuit quality, and thus a loss of system sensitivity.

This disadvantage can be substantially eliminated if the portion of the circuit capacitance which is not required for the matching variation of the capacitors 3c and 3d for the impedance of the transmission system is applied directly to the local coil as a fixed capacitor 9.

Figure 4:
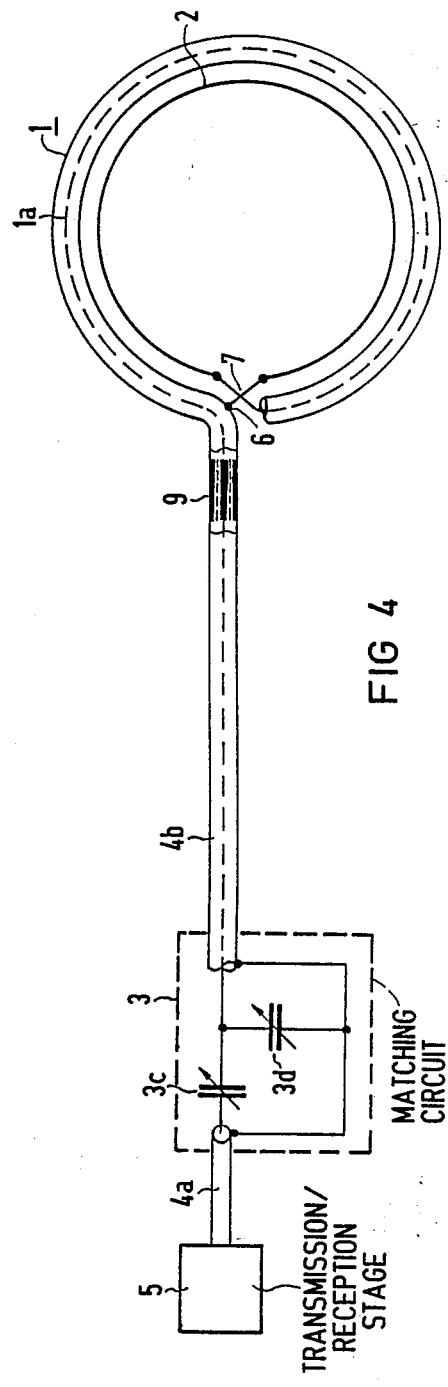
FIG. 4 is a third embodiment of a local coil for detecting nuclear magnetic resonance signals constructed in accordance with the principles of the present invention.

As shown in the embodiment of FIG. 4, the fixed capacitor 9 is constructed in a coaxial structure. Given suitable surface treatment of the capacitor coatings, the coaxial structure of the fixed capacitor 9 allows the effect ohmic losses, which are also associated with skin effect losses at higher frequencies, to be reduced. At the same time, the outside shielding of the capacitor avoids energy loss due to radiation.

It is also possible to form a fixed capacitor in a coaxial structure by a limited reduction of the intrinsic impendance of the first turn 1 of the local coil.

Although modifications and changes may be suggested by those skilled in the art it is the intention of the inventors to embody within the patent warranted hereon all changes and modifications as reasonably and properly come within the scope of their contribution to the art.

We claim as our invention:

1. A local coil system for detecting nuclear magnetic resonance signals from an examination subject, said system including a local coil comprising:
a first turn consisting of coaxial cable having an inner conductor and jacket shielding, said first turn having a starting point; and
at least one further turn consisting of unshielded conductor connected to said inner conductor and terminating with an electrical connection to said jacket shielding of said first turn at said starting point, each further turn being wound in the same direction as said first turn.

2. A local coil system as claimed in claim 1 for use with a transmission system having an impedance, and wherein said local coil has an impedance, said local coil system further comprising:
means for matching the impedance of said local coil to said impedance of said transmission system; and
a coaxial line connecting said means for matching two said local coil.

3. A local coil system as claimed in claim 2, wherein said means for matching includes a capacitance, a portion of said capacitance not being required for balancing variations in said means for matching with said impedance of said transmission system, and said portion of said capacitance being directly attached to said local coil as a fixed capacitor.

4. A local coil system as claimed in claim 3, wherein said fixed capacitor is a coaxial capacitor.

5. A local coil system as claimed in claim 1, wherein said first turn has a diameter, and at least one further turn has a diameter different from said diameter of said first turn.

6. A local coil system as claimed in claim 1, having at least two further turns, and wherein said first turn is disposed between said two further turns.

7. A local coil system as claimed in claim 1, wherein said first turn has a circular shape.

8. A local coil system as claimed in claim 1, wherein said at least one further turn has a circular shape.

9. A local coil system as claimed in claim 1, wherein said first turn and said at least one further turn both have a circular shape.

10. A local coil system as claimed in claim 1, wherein said first turn and said at least one further turn are disposed in the same plane.

* * * * *